United States Patent [19]

Vodanovic et al.

[11] Patent Number: 5,406,372
[45] Date of Patent: Apr. 11, 1995

[54] QFP LEAD QUALITY INSPECTION SYSTEM AND METHOD

[75] Inventors: Bojko Vodanovic, Beaconsfield; Michel Blanchard, St-Hyacinthe, both of Canada

[73] Assignee: Modular Vision Systems Inc., Montreal, Canada

[21] Appl. No.: 48,878

[22] Filed: Apr. 16, 1993

[51] Int. Cl.[6] .................................. G01B 11/24
[52] U.S. Cl. ........................ 356/394; 356/376; 356/237; 250/561; 348/87; 348/126
[58] Field of Search ............ 356/394, 398, 375, 376, 356/237, 377; 250/560, 561, 562, 563; 358/101, 106, 107; 29/705, 709, 710; 348/87, 92, 94, 95, 125, 126, 131, 132

[56] References Cited

U.S. PATENT DOCUMENTS

| | | | |
|---|---|---|---|
| 4,739,175 | 4/1988 | Tamura | 250/561 |
| 4,812,666 | 3/1989 | Wistrand | 250/561 |
| 4,874,956 | 10/1989 | Kato et al. | 250/560 |
| 4,978,220 | 12/1990 | Abramovich et al. | 356/394 |
| 5,162,866 | 11/1992 | Tomiya et al. | 356/398 |
| 5,192,983 | 3/1993 | Tokuka | 356/376 |

*Primary Examiner*—Hoa Q. Pham
*Attorney, Agent, or Firm*—Fishman, Dionne & Cantor

[57] ABSTRACT

The leads of a QFP are examined by an optical system. The optical system includes a sensor head having two lasers, the outputs of the lasers being fed to a beam splitter which provides outputs at right angles to each other, and a ring-light which is disposed under the beam splitter and in actual alignment with the beam splitter. The sensor head is carried by a carriage in a single plane along two transverse directions. The carriage moves the sensor heads so as to examine one lead at a time along the peripheral edges of the QFP.

6 Claims, 6 Drawing Sheets

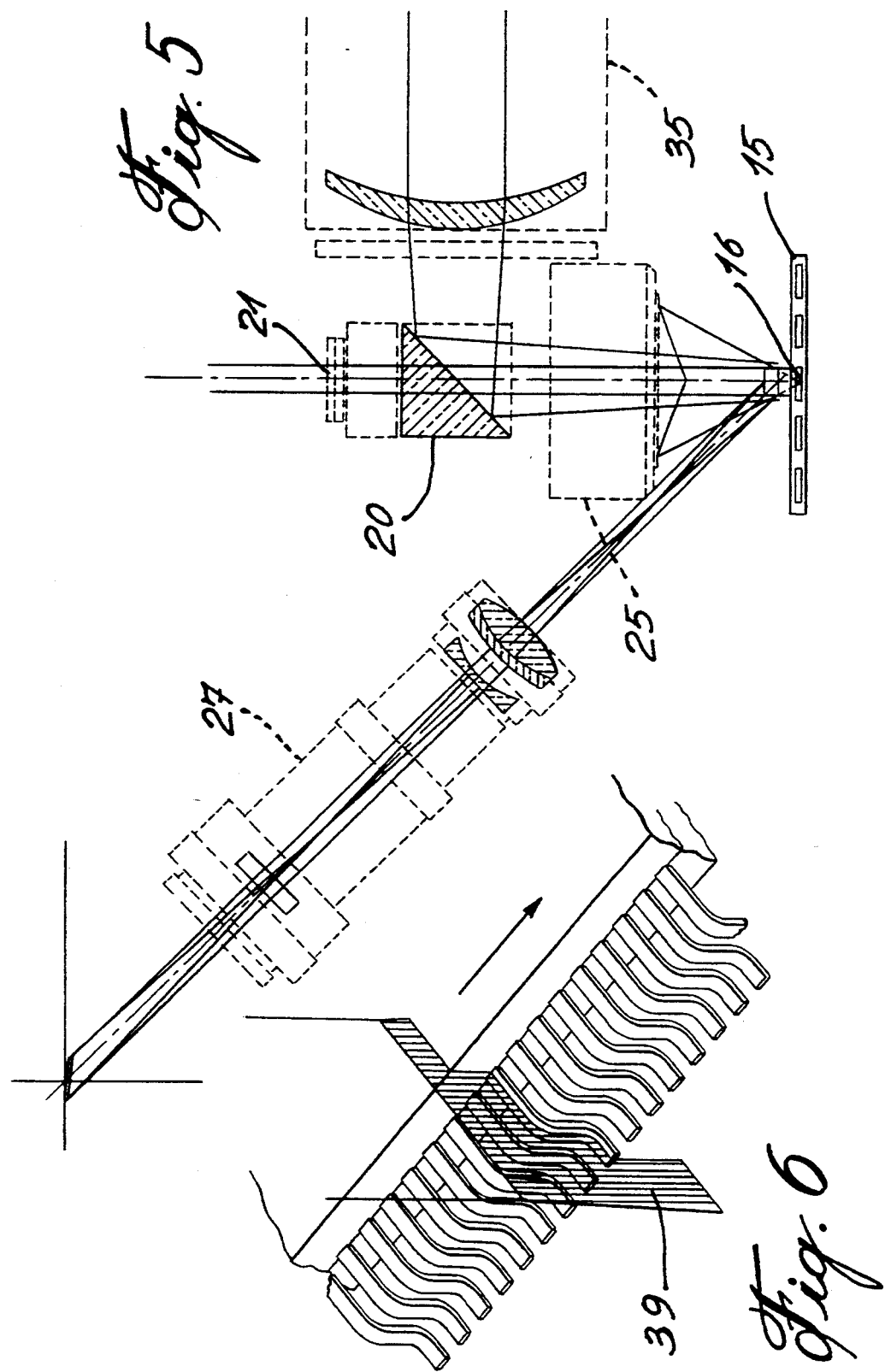

QFP LEAD QUALITY INSPECTION SYSTEM AND METHOD

BACKGROUND OF INVENTION

1. Field of the Invention

The invention relates to a system for inspecting parameters of leads on quad flat-pack (QFP) chip packages. The invention also relates to a method for inspecting these parameters using the inventive system.

2. Description of Prior Art

Large QFP chip packages have many (sometimes hundreds) of "gull wing" type leads on their perimeter. As technology advances, the size of these leads and clearance between them becomes smaller and smaller. It is necessary for all of the leads to have proper clearance. It is also necessary that the leads should not be bent out of shape, and that the leads should be coplanar, that is, when placed on a flat surface (for example a printed circuit board) all leads should either be touching the flat surface or have a minimum clearance which will still allow for proper soldering of the leads to the surface. Devices with out of specification leads can not be properly soldered resulting in higher manufacturing cost and, if not detected early, even costlier failures in the field.

To prevent damage of the very fragile leads, a dozen or more devices are packaged and shipped in special trays. These trays support the plastic or ceramic bodies, from whose periphery the leads extend, to leave the lead tips without any contact or strain.

SUMMARY OF INVENTION

The QFP inspection system as per the present application permits the thorough inspection of such lead qualities as clearances, bent lead conditions, overall lead position (geometry) and coplanarity of the leads of a flat-pack device without removing it from a standard tray. Such an approach guarantees that there is no possibility of further lead damage by the inspection system since there is no device manipulation. This also simplifies the handling (complete trays instead of individual devices). Moreover, as will be seen, all measurements are referenced to the lead shoulder plane—the only stable plane on the device—allowing for a meaningful statistical process control and upstream production adjustments.

In accordance with a particular embodiment of the invention there is provided a system for inspecting parameters of leads on quad flat-pack (QFP) chip packages, each QFP package having a plurality of side edges, said leads extending from said side edges; said system comprising:
A) a scanner assembly including;
  a) a sensor head arrangement;
  b) carriage means for moving said sensor head arrangement in a single plane either along a first direction or along a second direction transverse to said first direction;
  c) a support table for supporting said carriage means;
  d) tray means, underlying said sensor head arrangement, for holding at least one QFP package;
whereby, light from said sensor head arrangement is directed at said at least one QFP package, and light reflected from said QFP package is directed at said sensor head to determine said parameters; said carriage means moving said sensor head such that said leads are examined one lead at a time.

In accordance with a further particular embodiment of the invention there is provided a system for inspecting parameters of leads on quad flat-pack (QFP) chip packages, each QFP package having a plurality of side edges, said leads extending from said side edges;
a sensor head arrangement, comprising:
  a beam splitter having a longitudinal axis and an input for a first laser;
  a ring-light, underlying said beam splitter, and being axially aligned therewith;
  light from said beam splitter and said ring-light being directed at a QFP package, the light directed at said QFP package being reflected therefrom;
  a first lens and a second lens for receiving said reflected light, said first lens including means for blocking light from said ring-light and said second lens including means for blocking light from said laser;
  whereby, said first lens passes only light from said laser and said second lens passes only light from said ring-light.

In accordance with a still further particular embodiment of the invention there is provided a system for inspecting parameters of leads on quad flat-pack (QFP) chip packages, each QFP package having a plurality of side edges, said leads extending from said side edges;
a sensor head arrangement, comprising:
  a beam splitter having a longitudinal axis, a first input for a first laser along said longitudinal axis, and a second input for a second laser transverse to said longitudinal axis;
  a ring-light, underlying said beam splitter, and being axially aligned therewith;
  light from said beam splitter and said ring-light being directed at a QFP package, the light directed at said QFP package being reflected therefrom;
  a first lens, a second lens and a third lens for receiving said reflected light, said first and second lenses including means for blocking light from said ring-light, and said third lens including means for blocking light from said first and second lasers;
  whereby, said first and second lenses will pass only light from said first and second lasers and said third lens will pass only light from said ring-light.

BRIEF DESCRIPTION OF DRAWINGS

The invention will be better understood by an examination of the following description, together with the accompanying drawings, in which:

FIG. 5 is a more detailed partial side view of FIG. 4;
FIG. 6 illustrates how lead profile is determined.

DESCRIPTION OF PREFERRED EMBODIMENTS

Figure 1:
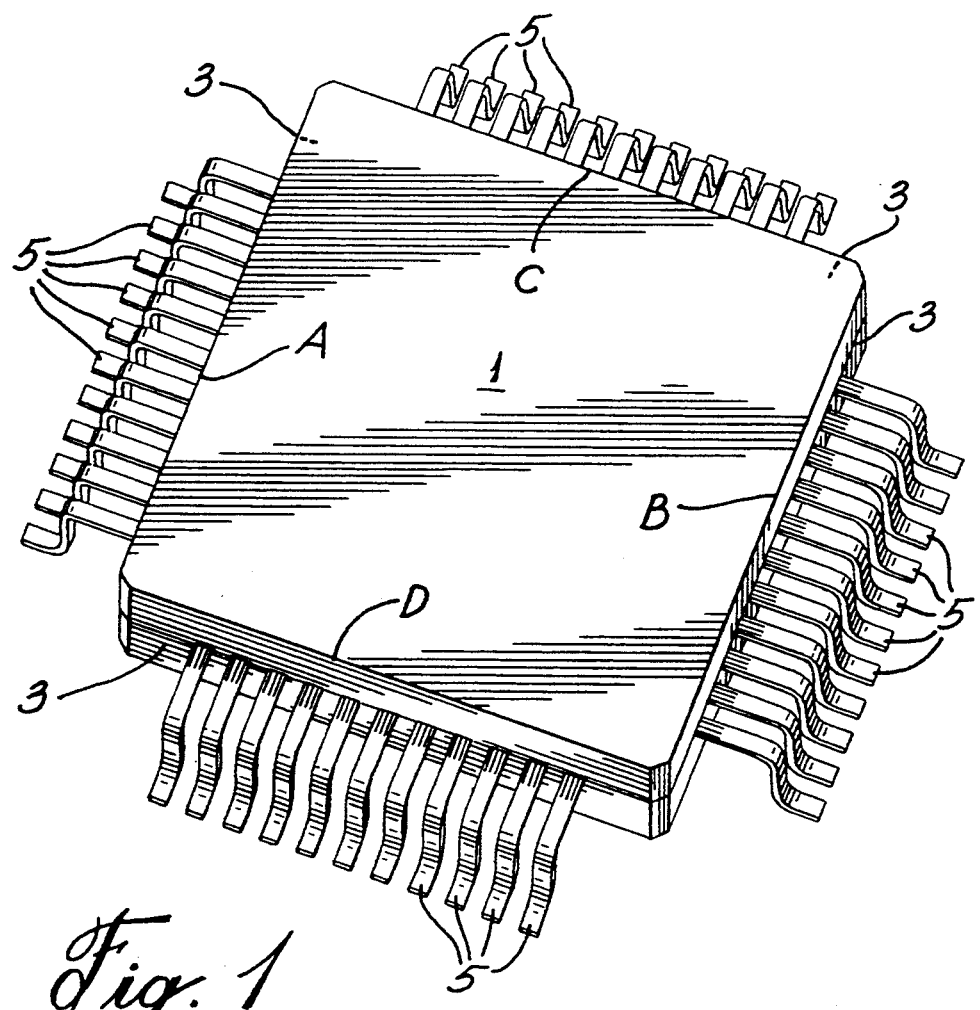
FIG. 1 is a perspective view of a QFP.

Referring to FIG. 1, it can be seen that a QFP comprises a body 1, made of either a plastic or ceramic material, having side edges 3. In the illustrated embodiment, the body is substantially square so that there are four side edges.

Extending from each of the side edges are a plurality of leads 5.

Figure 2:
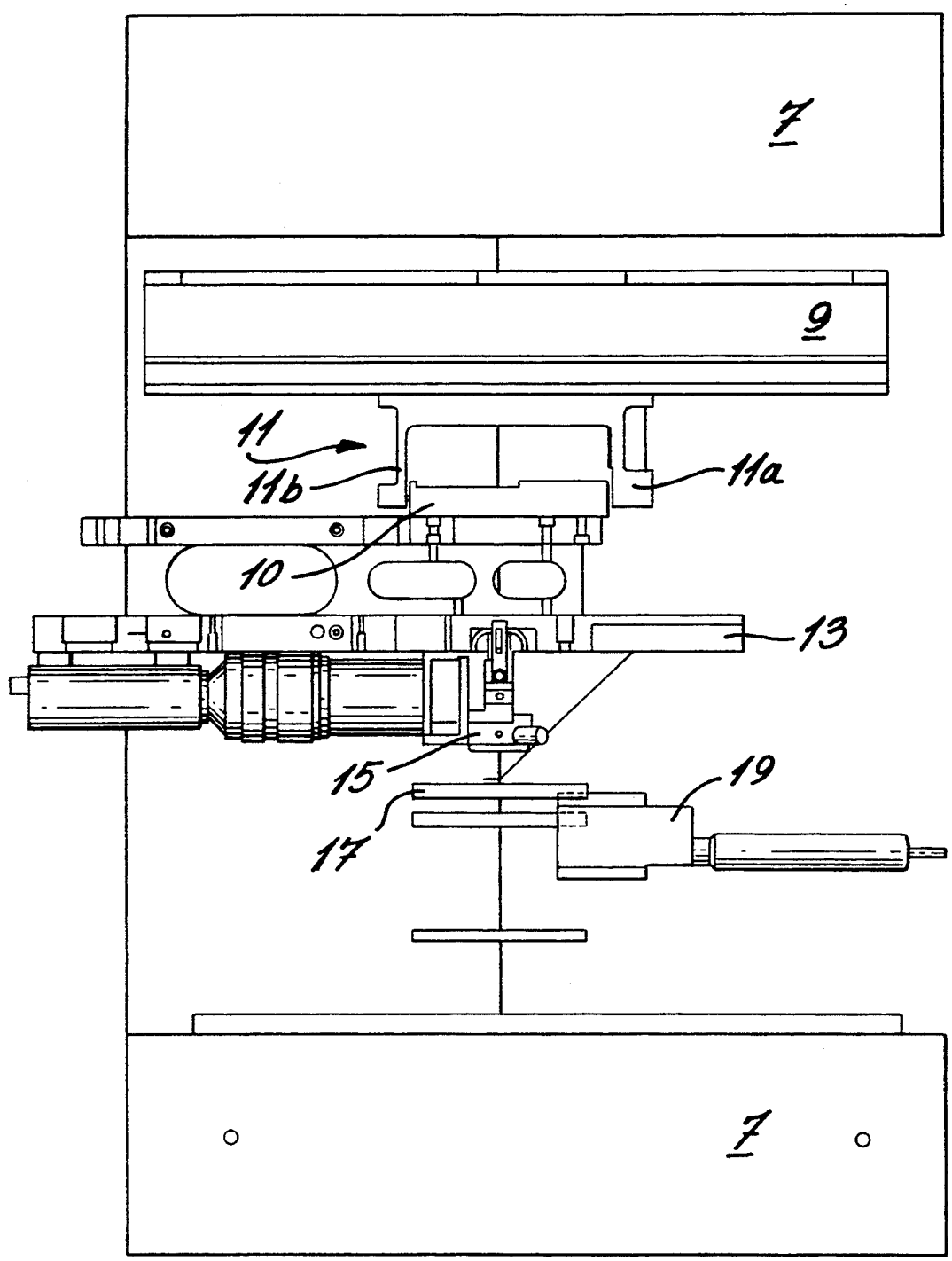
FIG. 2 is a side view of the inventive system.
Figure 3:
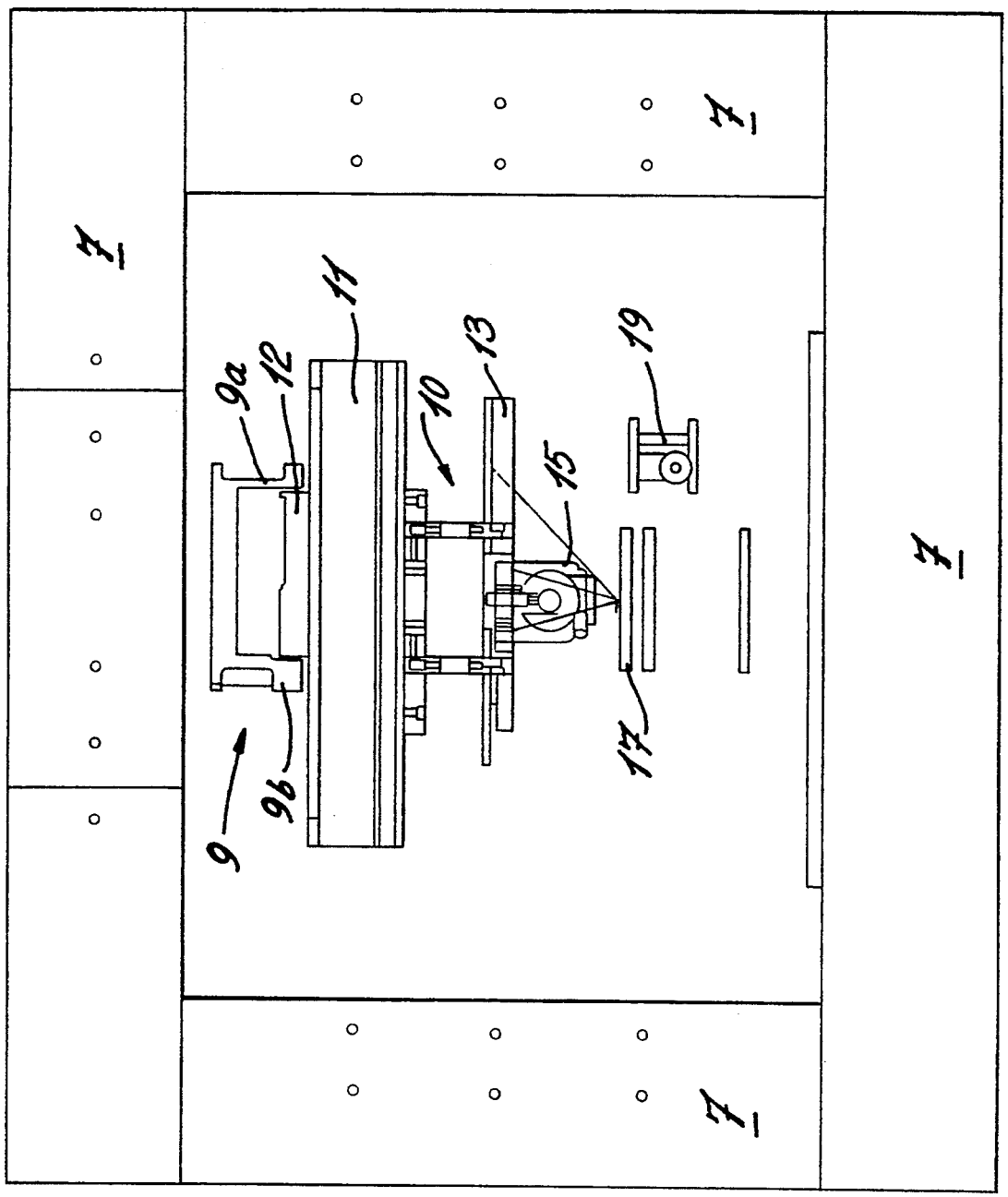
FIG. 3 is a front view of the inventive system.

Turning now to FIGS. 2 and 3, the system includes a granite support table 7 which supports all of the elements of the system. The system includes a carriage comprising a Y slide arrangement 9 and an X slide arrangement 11 driven by motors 10 and 12 respectively. The slide arrangements 9 and 11 comprise rails 9a and 9b and 11a and 11b respectively. Rails 9a and 9b slidingly support slide 11, and rails 11a and 11b slidingly support carrier 10. The carrier 10, in turn, supports sensor head carrier 13, which carries the sensor head 15. The carriage serves to carry sensor head 15 in a single plane and in two transverse (X and Y) directions along the rails 9a, 9b, and 11c, 11b. The tray 17 for carrying the QFPs is located below the sensor head 15. A Z table 19 is provided for calibration purposes.

Figure 4:
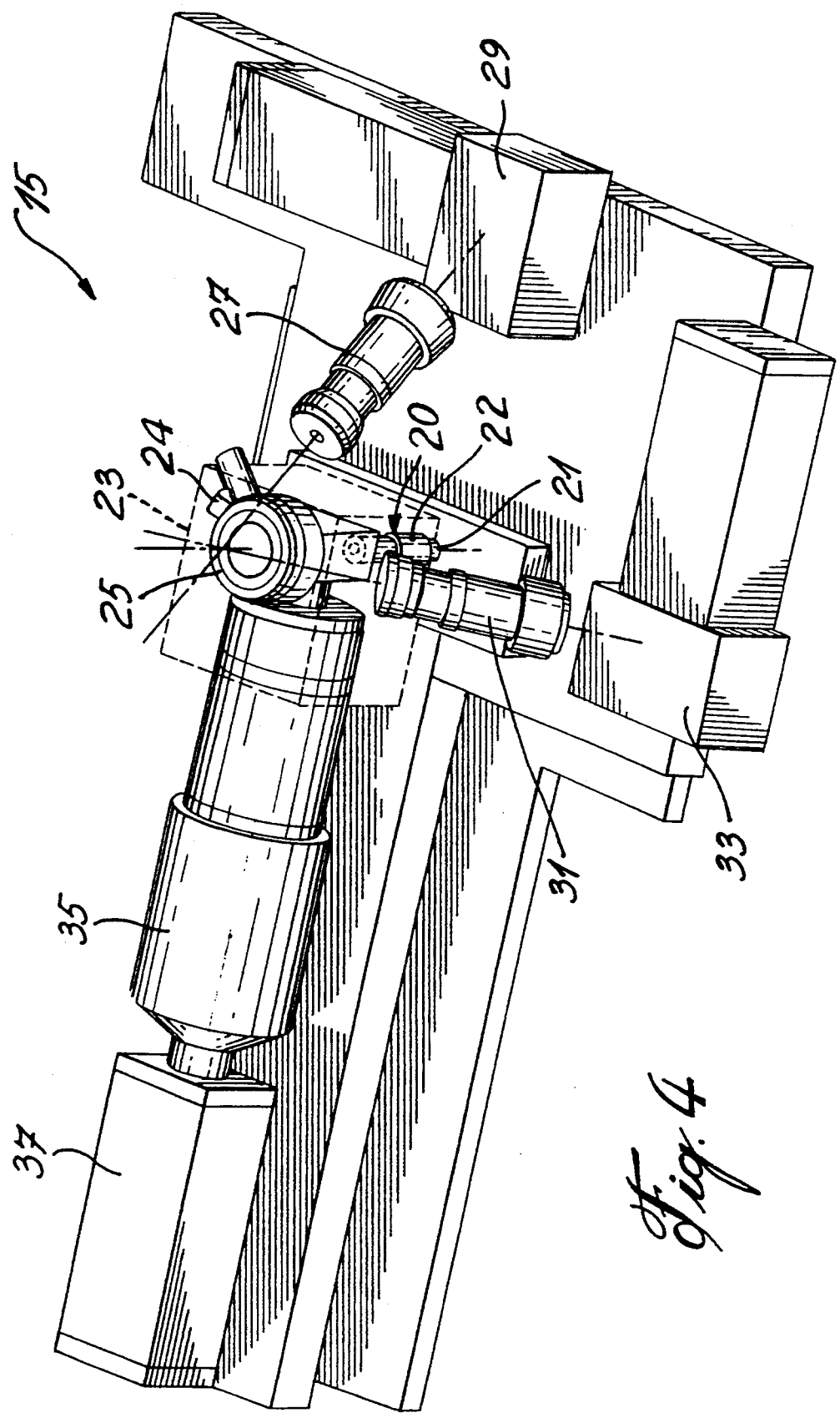
FIG. 4 is a perspective view of the sensor head of the inventive system.

The sensor head 15 is better illustrated in FIG. 4. Referring to FIG. 4, the sensor head 15 includes a beam splitter 20 which includes an input 21 for a first laser 22 and an input 23 for a second laser 24. Disposed below the beam splitter, and in axial alignment therewith, is a ring-light 25. As seen in FIG. 5, the laser beams are directed at a particular QFP 16 in tray 15. The light from the ring-light illuminates a surface which includes all of the QFP 16.

Returning to FIG. 4, a first macro lens 27 is associated with a first CCD (charge couple device) 29 such that the output of lens 27 is directed at the active portion of CCD 29. In the same way, a second macro lens 31 is associated with a second CCD 33. As can be seen, the first and the second lens 27 and 31 are in planes are at right angles to each other.

A telecentric lens 35 is directed at a third CCD 37.

The outputs of CCD's 29, 33 and 37 are fed to a processor 38 where the data of the CCD's, after being digitized, is processed and analyzed. The processor 38 is connected to a communication device 40 such as a display unit, a printer, or the like.

Referring to FIG. 6, laser 1 will provide a plane of light 39 in one direction, and laser 2 will provide a plane of light in a direction at right angles to the plane 39. As can be seen, the reflected laser light from one of the lasers will provide data concerning the profile of each lead along two parallel edges of the QFP. The reflected light from the other one of the lasers will provide data concerning the profiles of each lead on the two transverse parallel edges. Thus, for example, laser 1 could provide profile data about the profiles of the leads along edges A and B (see FIG. 1), while laser 2 would provide data concerning the profiles along edges C and D (see FIG. 1).

Figure 7:
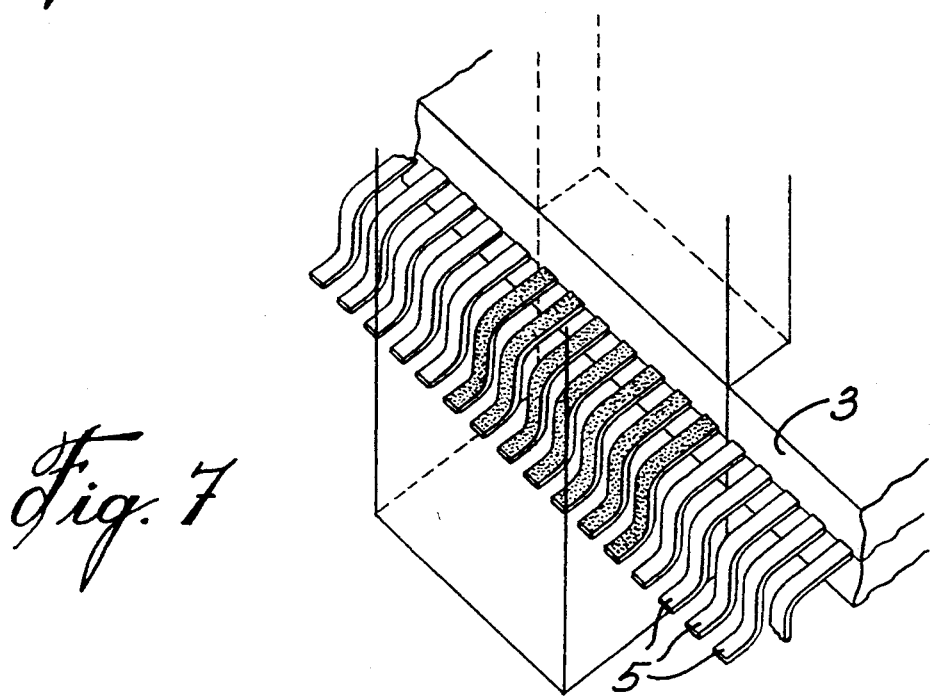
FIG. 7 illustrates how lead perimeter is determined.

As seen in FIG. 7, the ring-light will cover an area including at least one lead under observation. The picture that is presented to the CCD by the reflected ring-light light is the peripheral outline of the lead under observation.

In operation, the white light of the ring-light is strobed, and light from one of the lasers and the ring-light will simultaneously impinge on a selected one of the QFPs under observation. In fact, the light will impinge on a selected lead of the selected QFP.

The macro lenses 27 and 31 include interference filters which eliminate the strobed light of the ring-light, so that any of the strobed ring-light reflecting from the QFP will be prevented from reaching CCD 29 or CCD 33.

The telecentric lens 35 incorporates a red/infrared cut-off filter eliminating the laser light so that any of the laser light reflected from the QFP will not be directed to CCD 37. Accordingly, although light from one of the lasers and light from the ring-light will be directed at a QFP at the same time, and both laser light and ring-light light will be reflected from the QFP, only laser light will be directed at the CCDs 29 and 33, and only ring-light light will be directed at the CCD 37.

Figure 9:
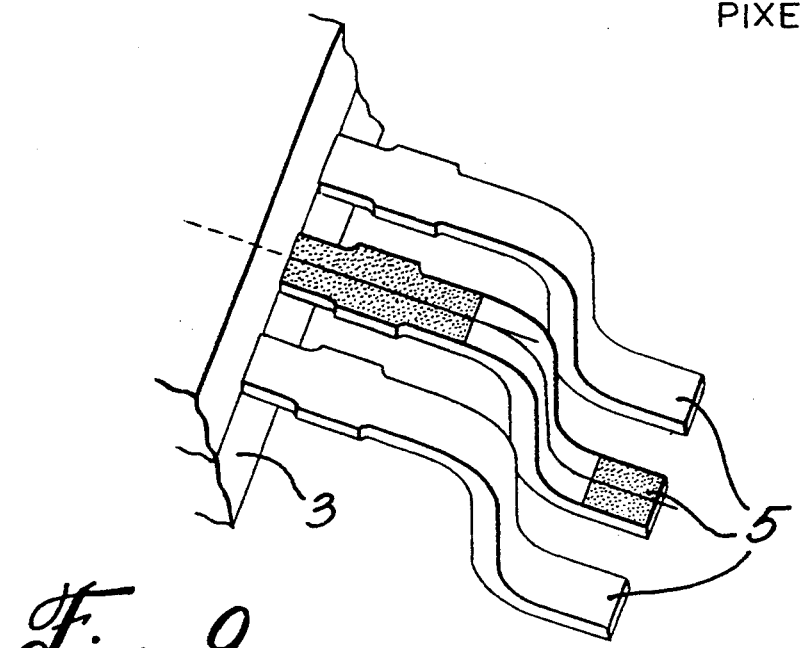
FIG. 9 illustrates the statistical procedure for determining lead periphery and lead spacing.

The sensor head will be positioned, by the carriage comprising slides 9 and 11, to one corner of a QFP. The ring-light is then turned ON to determine the peripheral characteristics of the lead at the corner of the QFP as well as it's central axis. For this purpose, over 300 lead edge points are extracted whereby to calculate both the lead edges and the lead axis. The slide is moved from the lead under observation towards an adjacent lead, and the appropriate laser is fired when the laser plane illuminated by that laser cuts the lead at the axis of the lead under observation. (See FIG. 9).

Figure 8:
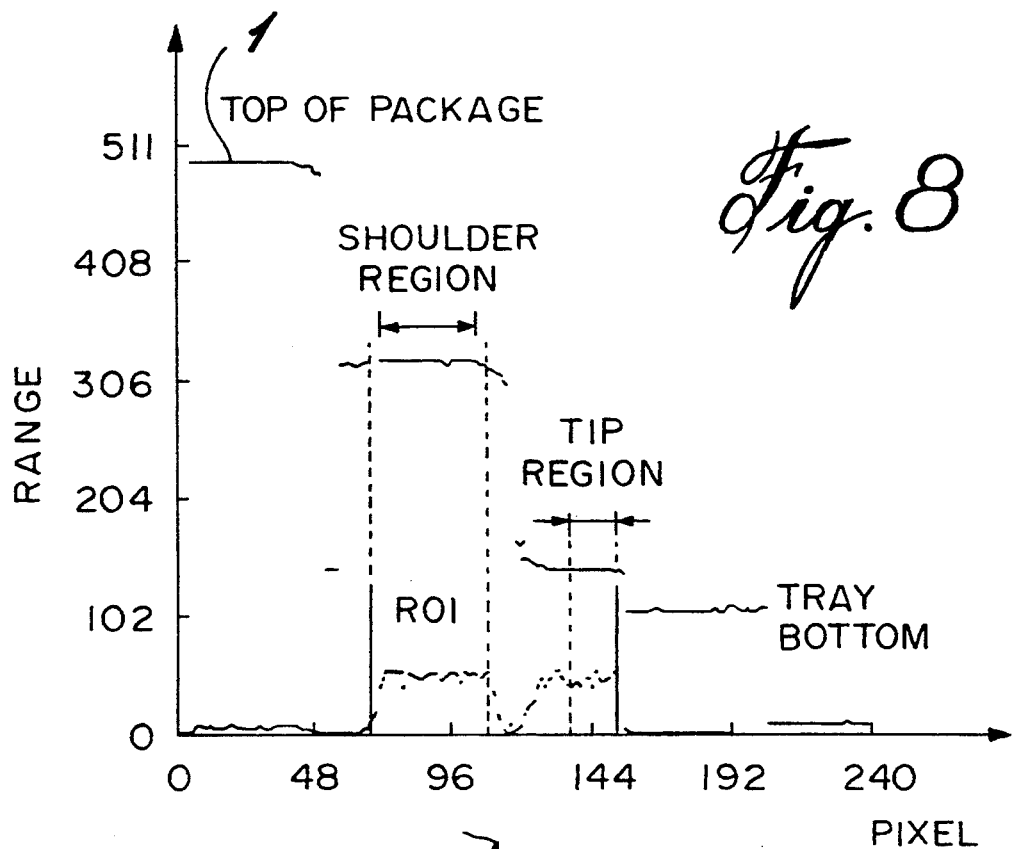
FIG. 8 illustrates the statistical procedure for determining lead profile.

Using the light reflected by the illuminated laser, approximately 150 points are acquired along the lead axis to precisely define the height profile of the lead. A linear regression algorithm is performed on the profile points at the tip and shoulder segment, as shown in FIG. 8, and the intersection of both line segments (tip profile and tip edge) at the tip defines the coplanarity point (tip center-see FIG. 9). The height measurements are taken relative to the shoulder plan for each lead.

After the profile information has been captured by the appropriate CCD, the illuminated laser is extinguished. In the meantime, the reflected light of the ring-light of the next adjacent lead is presented to CCD 37 so that the position of the axis of the next lead is calculated in processor 38, which also controls the action of the motors 10 and 12 and the turning ON and OFF of the lasers.

Although not shown in the drawings, the control terminals of the motors 10 and 12 will be connected to the computer 38 for this purpose. In addition, positioning information will be provided by the slides 9 and 11 so that the computer will have information as to the position of the sensor head 15. As it will also know the position of the tray 17, the computer will have information relating to relative position of the laser beam and ring-light light relative to the position of each QFP in the tray 17. The Z table 19 provides calibration information in the Z direction by moving the tray 17 upwardly and downwardly in FIGS. 1 and 2. It is pointed out that the axis of each lead is calculated using the geometrical center of the points at the shoulder region (outside the danbar area) and at the tip region (flat part). The axis along the tip edge points define the lead position for the true positional tolerance calculations.

Parameters of each of the leads along the first edge (A) are determined by moving the sensor head in the appropriate direction until the other end of that first edge is reached. The sensor head will then be driven in a transverse direction to determine the parameters along a second, transverse, edge (C) of the QFP. In the latter determination, it will be, of course, the second laser which is used.

After all of the leads on the one, the transverse, edge (C) have been observed, the leads along the third, transverse, edge (B) will be examined by the first laser, and when the leads along the third edge (B) have been examined, then the leads along the fourth, transverse, edge (D) will be examined by the second laser.

As can be seen, with the inventive apparatus, it is not necessary to physically engage or manipulate the QFPs. In addition, it is not necessary to turn the QFPs or the QFP holders in order to examine the leads on all four edges of the QFP.

In addition, the system determines both the peripheral characteristics of each lead as well as the profile of each lead at the same time to thereby increase the speed of operation. With the inventive system, it is possible to measure 120 leads per second.

Although a particular embodiment has been described, this was for the purpose of illustrating, but not limiting, the invention. Various modifications, which will come readily to the mind of one skilled in the art, are within the scope of the invention as defined in the appended claims.

We claim:

1. A system for inspecting parameters of leads on quad flat-pack (QFP) chip packages, each QFP package having a plurality of side edges, said leads extending from said side edges;
    a sensor head arrangement, comprising:
        a beam splitter having a longitudinal axis and an input for a first laser:
        a ring-light, underlying said beam splitter, and being axially aligned therewith;
        light from said beam splitter and said ring-light being directed at a QFP package, the light directed at said QFP package being reflected therefrom;
        a first lens and a second lens for receiving said reflected light, said first lens including means for blocking light from said ring-light and said second lens including means for blocking light from said laser;
    whereby, said first lens passes only light from said laser and said second lens passes only light from said ring-light.

2. A sensor head arrangement as defined in claim 1 and further including a first charge couple device (CCD) and a second charge couple device;
    the output of said first lens being connected to said first CCD and the output of said second lens being connected to said second CCD.

3. A sensor head arrangement as defined in claim 2 and further including a computer;
    the outputs of said first CCD and said second CCD being connected to said computer.

4. A system for inspecting parameters of leads on quad flat-pack (QFP) chip packages, each QFP package having a plurality of side edges, said leads extending from said side edges;
    a sensor head arrangement, comprising:
        a beam splitter having a longitudinal axis, a first input for a first laser along said longitudinal axis, and a second input for a second laser transverse to said longitudinal axis;
        a ring-light, underlying said beam splitter, and being axially aligned therewith;
        light from said beam splitter and said ring-light being directed at a QFP package, the light directed at said QFP package being reflected therefrom;
        a first lens, a second lens and a third lens for receiving said reflected light, said first and second lenses including means for blocking light from said ring-light, and said third lens including means for blocking light from said first and second lasers;
    whereby, said first and second lenses will pass only light from said first and second lasers and said third lens will pass only light from said ring-light.

5. A sensor head arrangement as defined in claim 4 and including a first charge couple device (CCD), a second CCD and a third CCD;
    the output of said first lens being fed to said first CCD, the output of said second lens being fed to said second CCD and the output of said third lens being fed to said third CCD.

6. A sensor head arrangement as defined in claim 5 and further including a computer;
    the outputs of said first CCD, said second CCD and said third CCD being fed to said computer.

* * * * *